United States Patent
Walter et al.

(10) Patent No.: US 10,513,780 B2
(45) Date of Patent: Dec. 24, 2019

(54) PLATING BATH COMPOSITION AND METHOD FOR ELECTROLESS PLATING OF PALLADIUM

(71) Applicant: Atotech Deutschland GmbH, Berlin (DE)

(72) Inventors: Andreas Walter, Berlin (DE); Christof Suchentrunk, Berlin (DE); Thomas Beck, Berlin (DE); Gerhard Steinberger, Berlin (DE); Holger Bera, Berlin (DE); Heiko Brunner, Berlin (DE); Bernd Froese, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 100 days.

(21) Appl. No.: 15/778,242

(22) PCT Filed: Nov. 28, 2016

(86) PCT No.: PCT/EP2016/079008
§ 371 (c)(1),
(2) Date: May 23, 2018

(87) PCT Pub. No.: WO2017/089610
PCT Pub. Date: Jun. 1, 2017

(65) Prior Publication Data
US 2018/0340260 A1 Nov. 29, 2018

(30) Foreign Application Priority Data
Nov. 27, 2015 (EP) .................................. 15196799

(51) Int. Cl.
| | |
|---|---|
| C23C 18/44 | (2006.01) |
| C23C 18/16 | (2006.01) |
| H05K 3/18 | (2006.01) |
| H01L 21/288 | (2006.01) |
| H05K 3/24 | (2006.01) |
| C23C 18/32 | (2006.01) |

(52) U.S. Cl.
CPC .......... *C23C 18/44* (2013.01); *C23C 18/1683* (2013.01); *H01L 21/288* (2013.01); *H05K 3/187* (2013.01); *H05K 3/244* (2013.01); *C23C 18/1651* (2013.01); *C23C 18/32* (2013.01); *H05K 2203/072* (2013.01); *H05K 2203/0736* (2013.01)

(58) Field of Classification Search
None
See application file for complete search history.

(56) References Cited

U.S. PATENT DOCUMENTS

| | | | | |
|---|---|---|---|---|
| 3,649,308 | A * | 3/1972 | Gulla ..................... | C23C 18/34 106/1.23 |
| 3,661,597 | A * | 5/1972 | Gulla .................... | C23C 18/405 106/1.26 |
| 3,663,242 | A * | 5/1972 | Gulla .................... | C23C 18/405 106/1.23 |
| 3,717,482 | A * | 2/1973 | Gulla ..................... | C23C 18/34 106/1.22 |
| 4,265,943 | A | 5/1981 | Goldstein et al. | |
| 4,623,554 | A * | 11/1986 | Kaschak ............. | C23C 18/1617 427/10 |
| 4,790,912 | A * | 12/1988 | Holtzman ............... | C25D 5/54 106/1.11 |
| 5,292,361 | A | 3/1994 | Otsuka et al. | |
| 5,882,736 | A | 3/1999 | Stein et al. | |
| 9,758,874 | B2 * | 9/2017 | Suchentrunk ....... | C23C 18/1637 |
| 9,790,607 | B1 * | 10/2017 | Schulz .................... | C25D 3/18 |
| 9,909,216 | B2 * | 3/2018 | Brunner .................. | C23C 18/34 |
| 9,960,051 | B2 * | 5/2018 | Suchentrunk ....... | C23C 18/1879 |
| 10,385,458 | B2 * | 8/2019 | Walter ................. | C23C 18/1651 |
| 2009/0133603 | A1 | 5/2009 | Murasumi et al. | |
| 2014/0110844 | A1 | 4/2014 | Uhlig et al. | |

(Continued)

FOREIGN PATENT DOCUMENTS

| | | |
|---|---|---|
| DE | 1771600 | 1/1972 |
| EP | 2887779 | 6/2015 |

(Continued)

OTHER PUBLICATIONS

PCT/EP2016/079008; PCT International Search Report and Written Opinion of the International Searching Authority dated Jan. 18, 2017.

(Continued)

*Primary Examiner* — Helene Klemanski
(74) *Attorney, Agent, or Firm* — Renner, Otto, Boisselle & Sklar, LLP

(57) ABSTRACT

The invention relates to an aqueous plating bath composition and a method for depositing a palladium layer by electroless plating onto a substrate. The aqueous plating bath composition according to the invention comprises a source for palladium ions, a reducing agent for palladium ions and an unsaturated compound. The aqueous plating bath composition according to the invention has an improved stability against undesired decomposition due to the unsaturated compounds while keeping the deposition rate for palladium at the desired satisfying value. The aqueous plating bath composition has also a prolonged life time. The unsaturated compounds of the invention allow for adjusting the deposition rate to a satisfying range over the bath life time and for electrolessly depositing palladium layers at lower temperatures.

14 Claims, 2 Drawing Sheets

(56) References Cited

U.S. PATENT DOCUMENTS

| | | | | |
|---|---|---|---|---|
| 2014/0377471 A1* | 12/2014 | Bera | .................. | C23C 18/1633 |
| | | | | 427/430.1 |
| 2015/0110965 A1* | 4/2015 | Brunner | ................. | C23C 18/34 |
| | | | | 427/430.1 |
| 2017/0321327 A1* | 11/2017 | Beck | ................... | C23C 18/1646 |
| 2017/0327954 A1* | 11/2017 | Brunner | ................. | C23C 18/34 |
| 2018/0340261 A1* | 11/2018 | Walter | ............... | C23C 18/1683 |

FOREIGN PATENT DOCUMENTS

| | | | | |
|---|---|---|---|---|
| GB | 1180891 | A | * | 2/1972 |
| GB | 1315212 | A | * | 5/1973 |

OTHER PUBLICATIONS

PCT/EP2016/079008; PCT International Preliminary Report on Patentability dated Feb. 12, 2018.

* cited by examiner

PLATING BATH COMPOSITION AND METHOD FOR ELECTROLESS PLATING OF PALLADIUM

The present application is a U.S. National Stage Application based on and claiming benefit and priority under 35 U.S.C. § 371 of International Application No. PCT/EP2016/079008, filed 28 Nov. 2016, which in turn claims benefit of and priority to European Application No. 15196799.9 filed 27 Nov. 2015, the entirety of both of which is hereby incorporated herein by reference.

FIELD OF THE INVENTION

The present invention relates to aqueous plating bath compositions and methods for electroless plating of palladium in the manufacture of printed circuit boards, IC substrates and for metallization of semiconductor wafers.

BACKGROUND OF THE INVENTION

Electroless deposition of palladium in the manufacture of printed circuit boards, IC substrates and the like as well as metallization of semiconductor wafers is an established technique. The palladium layers are used for example as barrier layers and/or wire-bondable and solderable finishes.

Electroless palladium plating bath compositions comprising a source for palladium ions, a nitrogenated complexing agent and a reducing agent selected from formic acid and derivatives thereof are disclosed in U.S. Pat. No. 5,882,736. Such electroless palladium plating bath compositions are suited to deposit pure palladium in contrast to plating bath compositions containing hypophosphite as reducing agent which result in palladium-phosphorous alloy layers.

The stability of plating bath compositions comprising palladium ions is an important feature of such plating bath compositions due to the high price of palladium and the requirement for palladium layers deposited having predictable properties such as internal stress, and a high adhesion to the underlying substrate whereon the palladium layer is deposited.

The stability of such a plating bath means that the plating bath is stable against decomposition, i.e. the undesired precipitation of metallic palladium in the plating bath itself. Accordingly, a stable plating bath has a longer life time than an unstable plating bath. At the same time, the deposition rate of palladium from such a plating bath should be high enough to fulfill the requirements for an industrial palladium plating method.

Thus, there is still a need for stabilising electroless palladium plating baths while keeping the deposition rate at satisfying values.

OBJECTIVE OF THE PRESENT INVENTION

It is an objective of the invention to provide a plating bath composition and a method for electroless plating of palladium wherein the plating bath stability against undesired decomposition is increased. It is a further objective of the invention to provide a plating bath composition and a method for electroless plating of palladium which allow for keeping the deposition rate at the desired satisfying value. It is a further objective of the invention to provide a plating bath composition and a method for electroless plating of palladium which allow for increasing the life time of the plating bath.

SUMMARY OF THE INVENTION

These objectives are solved with an aqueous plating bath composition for electroless deposition of palladium, comprising
(i) at least one source for palladium ions,
(ii) at least one reducing agent for palladium ions, and
(iii) at least one unsaturated compound selected from compounds according to Formulae (I) and (II), salts thereof, and mixtures of the aforementioned

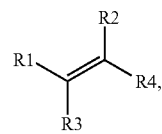

Formula (I)

Formula (II)

wherein R1, R3, R5 are selected independently of each other from the group consisting of —H; unsubstituted or substituted, linear C1 to C20 alkyl group; unsubstituted or substituted, branched C3 to C20 alkyl group; and unsubstituted or substituted aryl groups; and
wherein R2, R4 are selected independently of each other from the group consisting of —H; unsubstituted or substituted, linear C1 to C20 alkyl group; unsubstituted or substituted, branched C3 to C20 alkyl group; unsubstituted or substituted aryl groups; and —(CH(R10))$_n$-X—(C(R9)(R8))$_m$-R7; and wherein R2 is not —H if R4 is —H or R4 is not —H if R2 is —H; and
wherein R6 is selected from the group consisting of unsubstituted or substituted, linear C1 to C20 alkyl group; unsubstituted or substituted, branched C3 to C20 alkyl group; unsubstituted or substituted aryl groups; and —(CH(R10))$_n$-X—(C(R8)(R9))$_m$-R7; and
wherein X is selected from the group consisting of O, NH, and NCH$_3$; R7 is selected from the group consisting of hydroxyl, amino, sulfonic acid, carboxyl; R8, R9, R10 are selected independently of each other from the group consisting of hydrogen and C1 to C4 alkyl group; n is an integer ranging from 1 to 6; and m is an integer ranging from 1 to 8, and
wherein substituents of the substituted, linear C1 to C20 alkyl group; the substituted, branched C3 to C20 alkyl group; or the substituted aryl groups are selected independently of each other from the group consisting of hydroxyl, aldehyde, sulfonic acid, mercapto, methoxy, ethoxy, halogen, allyl, vinyl, phenyl, pyridyl and naphthyl groups.

These objectives are further solved by a method for electroless palladium plating comprising the steps of
(a) providing a substrate,
(b) contacting the substrate with the aqueous plating bath composition as described above and thereby depositing a layer of palladium onto at least a portion of the substrate.

The aqueous plating bath composition according to the invention is called the composition or the composition according to the invention herein. The terms "plating" and "depositing" are used interchangeably herein.

The unsaturated compounds according to Formulae (I) and (II) provide the aqueous plating bath composition according to the invention with an improved stability against undesired decomposition and a prolonged life time. Thus, the unsaturated compounds according to Formulae (I) and (II) act as stabilizing agents in the aqueous plating bath composition for electroless deposition of palladium. Further the unsaturated compounds according to Formulae (I) and (II) provide the aqueous plating bath composition according to the invention with decreased sensitivity to contaminations. Furthermore, the stable performance of the aqueous plating bath composition in the method for electroless palladium plating allows deposition of palladium layers having desired physical properties over an extended period of time. In addition, adding the unsaturated compounds according to Formulae (I) and (II) to an electroless palladium plating bath allows for keeping the deposition rate at satisfying values over the bath life time.

DETAILED DESCRIPTION OF THE INVENTION

Figure 1:
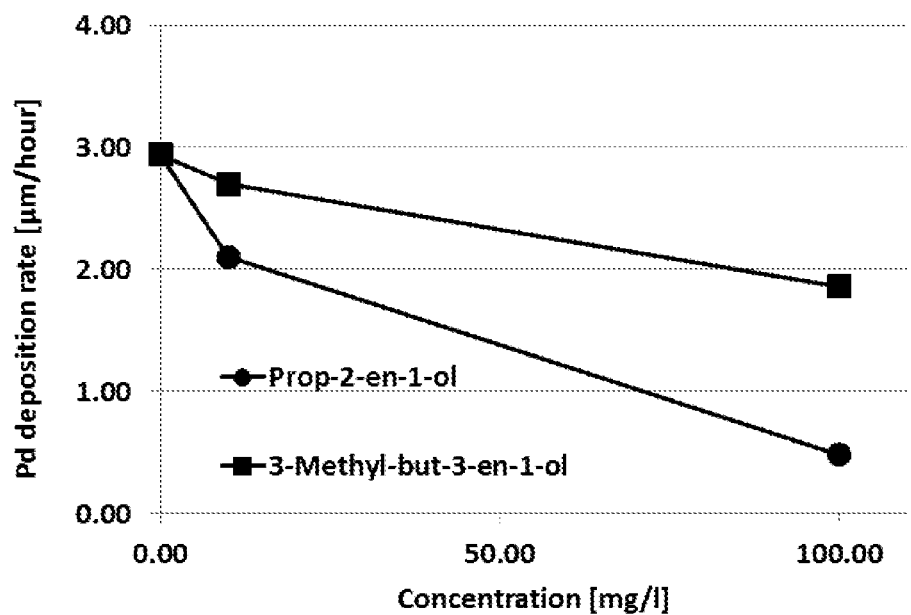
FIG. 1 shows the deposition rate of aqueous plating bath compositions containing prop-2-en-1-ol or 3-methyl-but-3-en-1-ol.

The present description relates to an aqueous plating bath composition for electroless deposition of palladium, comprising
(i) at least one source for palladium ions,
(ii) at least one reducing agent for palladium ions, and
(iii) at least one unsaturated compound selected from compounds according to Formulae (I) and (II), salts thereof, and mixtures of the aforementioned

Formula (I)

Formula (II)

wherein R1, R3, R5 are selected independently of each other from the group consisting of —H; unsubstituted or substituted, linear C1 to C20 alkyl group; unsubstituted or substituted, branched C3 to C20 alkyl group; and unsubstituted or substituted aryl groups; and
wherein R2, R4 are selected independently of each other from the group consisting of —H; unsubstituted or substituted, linear C1 to C20 alkyl group; unsubstituted or substituted, branched C3 to C20 alkyl group; unsubstituted or substituted aryl groups; and —(CH(R10))$_n$-X—(C(R9)(R8))$_m$-R7; and wherein R2 is not —H if R4 is —H or R4 is not —H if R2 is —H; and
wherein R6 is selected from the group consisting of unsubstituted or substituted, linear C1 to C20 alkyl group; unsubstituted or substituted, branched C3 to C20 alkyl group; unsubstituted or substituted aryl groups; and —(CH(R10))$_n$-X—(C(R8)(R9))$_m$-R7; and
wherein X is selected from the group consisting of O, NH, and NCH$_3$; R7 is selected from the group consisting of hydroxyl, amino, sulfonic acid, carboxyl; R8, R9, R10 are selected independently of each other from the group consisting of hydrogen and C1 to C4 alkyl group; n is an integer ranging from 1 to 6; and m is an integer ranging from 1 to 8.

The aqueous plating bath composition according to the invention preferably comprises (iii) at least one unsaturated compound selected from compounds according to Formulae (I) and (II), salts thereof, and mixtures of the aforementioned

Formula (I)

Formula (II)

wherein R1, R3, R5 are selected independently of each other from the group consisting of —H; unsubstituted or substituted, linear C1 to C20 alkyl group; unsubstituted or substituted, branched C3 to C20 alkyl group; and unsubstituted or substituted aryl groups; and
wherein R2, R4 are selected independently of each other from the group consisting of —H; unsubstituted or substituted, linear C1 to C20 alkyl group; unsubstituted or substituted, branched C3 to C20 alkyl group; unsubstituted or substituted aryl groups; and —(CH(R10))$_n$-X—(C(R8)(R9))$_m$-R7; and wherein R2 is not —H if R4 is —H or R4 is not —H if R2 is —H; and
wherein R6 is selected from the group consisting of unsubstituted or substituted, linear C1 to C20 alkyl group; unsubstituted or substituted, branched C3 to C20 alkyl group; unsubstituted or substituted aryl groups; and —(CH(R10))$_n$-X—(C(R8)(R9))$_m$-R7; and
wherein X is selected from the group consisting of O, NH, and NCH$_3$; R7 is selected from the group consisting of hydroxyl, amino, sulfonic acid, carboxyl; R8, R9, R10 are selected independently of each other from the group consisting of hydrogen and C1 to C4 alkyl group; n is an integer ranging from 1 to 6; and m is an integer ranging from 1 to 8, and
wherein substituents of the substituted, linear C1 to C20 alkyl group; the substituted, branched C3 to C20 alkyl group; or the substituted aryl groups are selected independently of each other from the group consisting of hydroxyl, aldehyde, sulfonic acid, mercapto, methoxy, ethoxy, halogen, allyl, vinyl, phenyl, pyridyl and naphthyl groups.

In one embodiment, the at least one unsaturated compound according to (iii) is selected from compounds according to Formula (I) or Formula (II), salts thereof, and mixtures of the aforementioned, wherein the compounds according to Formula (I) are preferably in cis configuration. Thus, R1 and R2 are not —H while R3 and R4 are —H or vice versa R1 and R2 are —H while R3 and R4 are not —H.

In another embodiment, R1, R3, R5 are selected independently of each other from the group consisting of —H; unsubstituted linear C1 to C20 alkyl group; unsubstituted branched C3 to C20 alkyl group; and unsubstituted aryl groups; and R2, R4 are selected independently of each other from the group consisting of —H; unsubstituted or substituted, linear C1 to C20 alkyl group; unsubstituted or substituted, branched C3 to C20 alkyl group; unsubstituted or substituted aryl groups; and —(CH(R10))$_n$-X—(C(R8)(R9))$_m$-R7; and wherein R2 is not —H if R4 is —H or R4 is not —H if R2 is —H; and wherein R6 is selected from the group consisting of unsubstituted or substituted, linear C1 to C20 alkyl group; unsubstituted or substituted, branched C3 to C20 alkyl group; unsubstituted or substituted aryl groups; and —(CH(R10))$_n$-X—(C(R8)(R9))$_m$-R7; and wherein X is selected from the group consisting of O and NH; R7 is selected from the group consisting of hydroxyl, amino, sulfonic acid, carboxyl; R8, R9, R10 are selected independently of each other from the group consisting of hydrogen and C1 to C4 alkyl group; n is an integer ranging from 1 to 6; and m is an integer ranging from 1 to 8.

In another embodiment, R1, R3, R5 are —H; and

R2, R4 are selected independently of each other from the group consisting of —H; unsubstituted or substituted, linear C1 to C20 alkyl group; unsubstituted or substituted, branched C3 to C20 alkyl group; unsubstituted or substituted aryl groups; and —(CH(R10))$_n$-X—(C(R8)(R9))$_m$-R7; and wherein R2 is not —H if R4 is —H or R4 is not —H if R2 is —H; and wherein R6 is selected from the group consisting of unsubstituted or substituted, linear C1 to C20 alkyl group; unsubstituted or substituted, branched C3 to C20 alkyl group; unsubstituted or substituted aryl groups; and —(CH(R10))$_n$-X—(C(R8)(R9))$_m$-R7; and wherein X is selected from the group consisting of O and NH; R7 is selected from the group consisting of hydroxyl, amino, sulfonic acid, carboxyl; R8, R9, R10 are selected independently of each other from the group consisting of hydrogen and C1 to C4 alkyl group; n is an integer ranging from 1 to 6; and m is an integer ranging from 1 to 8.

In another embodiment, R1, R3, R5 are selected independently of each other from the group consisting of —H; unsubstituted or substituted, linear C1 to C20 alkyl group; unsubstituted or substituted, branched C3 to C20 alkyl group; and unsubstituted or substituted aryl groups; and R2, R4 are selected independently of each other from the group consisting of —H; unsubstituted or substituted, linear C1 to C20 alkyl group; unsubstituted or substituted, branched C3 to C20 alkyl group; and unsubstituted or substituted aryl groups, and wherein R2 is not —H if R4 is —H or R4 is not —H if R2 is —H; and wherein R6 is selected from the group consisting of unsubstituted or substituted, linear C1 to C20 alkyl group; unsubstituted or substituted, branched C3 to C20 alkyl group; unsubstituted or substituted aryl groups.

In another embodiment, R1, R3, R5 are selected independently of each other from the group consisting of —H; unsubstituted or substituted, linear C1 to C20 alkyl group; and unsubstituted or substituted, branched C3 to C20 alkyl group; and R2, R4 are selected independently of each other from the group consisting of —H; unsubstituted or substituted, linear C1 to C20 alkyl group; and unsubstituted or substituted, branched C3 to C20 alkyl group; and —(CH(R10))$_n$-X—(C(R8)(R9))$_m$-R7; and wherein R2 is not —H if R4 is —H or R4 is not —H if R2 is —H; and wherein R6 is selected from the group consisting of unsubstituted or substituted, linear C1 to C20 alkyl group; unsubstituted or substituted, branched C3 to C20 alkyl group; and —(CH(R10))$_n$-X—(C(R8)(R9))$_m$-R7; and wherein X is selected from the group consisting of O and NH; R7 is selected from the group consisting of hydroxyl, amino, sulfonic acid, carboxyl; R8, R9, R10 are selected independently of each other from the group consisting of hydrogen and C1 to C4 alkyl group; n is an integer ranging from 1 to 6; and m is an integer ranging from 1 to 8.

In another embodiment, the at least one unsaturated compound according to (iii) is selected from compounds according to Formula (I), salts thereof, and mixtures of the aforementioned, and R1, R3 are selected independently of each other from the group consisting of —H; unsubstituted or substituted, linear C1 to C20 alkyl group; unsubstituted or substituted, branched C3 to C20 alkyl group; and unsubstituted or substituted aryl groups; and R2, R4 are selected independently of each other from the group consisting of —H; unsubstituted or substituted, linear C1 to C20 alkyl group; unsubstituted or substituted, branched C3 to C20 alkyl group; unsubstituted or substituted aryl groups; and —(CH(R10))$_n$-X—(C(R8)(R9))$_m$-R7; and wherein R2 is not —H if R4 is —H or R4 is not —H if R2 is —H; and wherein X is selected from the group consisting of O and NH; R7 is selected from the group consisting of hydroxyl, amino, sulfonic acid, carboxyl; R8, R9, R10 are selected independently of each other from the group consisting of hydrogen and C1 to C4 alkyl group; n is an integer ranging from 1 to 6; and m is an integer ranging from 1 to 8.

In a preferred embodiment, R1, R3, R5 are selected independently of each other from the group consisting of —H; unsubstituted or substituted, linear C1 to C10 alkyl group, more preferably from an unsubstituted or substituted, linear C1 to C5 alkyl group; even more preferably from n-pentyl group, n-butyl group, n-propyl group, ethyl group and methyl group, most preferably n-propyl group, ethyl group and methyl group; unsubstituted or substituted, branched C3 to C10 alkyl group, more preferably from an unsubstituted or substituted, branched C3 to C6 alkyl group; even more preferably from 2-pentyl (sec-pentyl) group, 3-pentyl group, 2-methylbutyl group, 3-methylbutyl (iso-pentyl) group, 3-methylbut-2-yl group, 2-methylbut-2-yl group, 2,2-dimethylpropyl (neo-pentyl) group, iso-butyl group, sec-butyl group, tert-butyl group, iso-propyl group; most preferably from 2-pentyl (sec-pentyl) group, 3-pentyl group, 3-methylbut-2-yl group, 2-methylbut-2-yl group, 2,2-dimethylpropyl, sec-butyl group, tert-butyl group, and iso-propyl group; and unsubstituted or substituted aryl groups; and R2, R4 are selected independently of each other from the group consisting of —H; unsubstituted or substituted, linear C1 to C10 alkyl group, more preferably from an unsubstituted or substituted, linear C1 to C5 alkyl group; even more preferably from n-pentyl group, n-butyl group, n-propyl group, ethyl group and methyl group, most preferably n-propyl group, ethyl group and methyl group; unsubstituted or substituted, branched C3 to C10 alkyl group, more preferably from an unsubstituted or substituted, branched C3 to C6 alkyl group; even more preferably from 2-pentyl (sec-pentyl) group, 3-pentyl group, 2-methylbutyl group, 3-methylbutyl (iso-pentyl) group, 3-methylbut-2-yl group, 2-methylbut-2-yl group, 2,2-dimethylpropyl (neo-pentyl) group, iso-butyl group, sec-butyl group, tert-butyl group, iso-propyl group; most preferably from 2-pentyl (sec-pentyl) group, 3-pentyl group, 3-methylbut-2-yl group, 2-methylbut-2-yl group, 2,2-dimethylpropyl, sec-butyl group, tert-butyl group, and iso-propyl group; unsubstituted or substituted aryl groups; and —(CH(R10))$_n$-X—(C(R8)(R9))$_m$-R7; and wherein R2 is not —H if R4 is —H or R4 is not —H if R2 is —H; and R6 is selected from the group consisting of unsubstituted or substituted, linear C1 to C10 alkyl group, more preferably from an unsubstituted or substituted, linear C1 to C5 alkyl group; even more preferably from n-pentyl group, n-butyl group, n-propyl group, ethyl group and methyl group, most preferably n-propyl group, ethyl group and methyl group; unsubstituted or substituted, branched C3 to C10 alkyl group, more preferably from an unsubstituted or substituted, branched C3 to C6 alkyl group; even more preferably from 2-pentyl (sec-pentyl) group, 3-pentyl group, 2-methylbutyl group, 3-methylbutyl (iso-pentyl) group, 3-methylbut-2-yl group, 2-methylbut-2-yl group, 2,2-dimethylpropyl (neopentyl) group, iso-butyl group, sec-butyl group, tert-butyl group, iso-propyl group; most preferably from 2-pentyl (sec-pentyl) group, 3-pentyl group, 3-methylbut-2-yl group, 2-methylbut-2-yl group, 2,2-dimethylpropyl, sec-butyl group, tert-butyl group, and iso-propyl group; unsubstituted or substituted aryl groups; and —(CH(R10))$_n$-X—(C(R8)(R9))$_m$-R7;

wherein X is selected from the group consisting of O and NH; R7 is selected from the group consisting of hydroxyl, amino, sulfonic acid, carboxyl; R8, R9, R10 are selected independently of each other from the group consisting of hydrogen, methyl and ethyl group, preferably from hydrogen and methyl group; n is an integer ranging from 1 to 4, preferably n is 1 or 2; and m is an integer ranging from 1 to 6, preferably m is 1, 2, 3 or 4.

In a further preferred embodiment, R1, R3, R5 are selected independently of each other from the group consisting of —H; unsubstituted or substituted, linear C1 to C5 alkyl group; unsubstituted or substituted, branched C3 to C6 alkyl group; and unsubstituted or substituted aryl groups; and R2, R4 are selected independently of each other from the group consisting of —H; unsubstituted or substituted, linear C1 to C5 alkyl group; unsubstituted or substituted, branched C3 to C6 alkyl group; unsubstituted or substituted aryl groups; and —(CH(R10))$_n$-X—(C(R8)(R9))$_m$-R7; and wherein R2 is not —H if R4 is —H or R4 is not —H if R2 is —H; and R6 is selected from the group consisting of unsubstituted or substituted, linear C1 to C5 alkyl group; unsubstituted or substituted, branched C3 to C6 alkyl group; unsubstituted or substituted aryl groups; and —(CH(R10))$_n$-X—(C(R8)(R9))$_m$-R7; and wherein X is selected from the group consisting of O and NH; R7 is selected from the group consisting of hydroxyl, amino, sulfonic acid, carboxyl; R8, R9, R10 are selected independently of each other from the group consisting of hydrogen and methyl group; n is 1 or 2; and m is 1, 2, 3 or 4.

In another embodiment, the unsubstituted or substituted aryl groups according to R1, R2, R3, R4, R5, R6 are selected independently of each other from the group consisting of phenyl, pyridyl and naphthyl; preferably phenyl and pyridyl; more preferably pyridyl.

In another embodiment, the amino group according to R7 is preferably selected from —NH$_2$, —NH(R11), —N(R11)(R12), —N$^+$(R11)(R12)(R13), wherein R11, R12, R13 are selected independently of each other from methyl, ethyl, n-propyl and iso-propyl. More preferably, the amino group of R7 is selected from —NH$_2$, —NHCH$_3$, —N(CH$_3$)$_2$, —N$^+$(CH$_3$)$_3$, —NHC$_2$H$_5$, —N(C$_2$H$_5$)$_2$ or —N$^+$(C$_2$H$_5$)$_3$.

More preferably, the amino group of R7 is selected from —NH$_2$, —NHCH$_3$, —N(CH$_3$)$_2$, —NHC$_2$H$_5$ or —N(C$_2$H$_5$)$_2$.

Preferably, the C1 to C4 alkyl group according to R8, R9, R10 is not substituted.

In another embodiment, the linear alkyl groups, the branched alkyl groups or the aryl groups according to R1, R2, R3, R4, R5, R6 as defined in the above-mentioned embodiments are substituted. Preferably, the linear C1 to C20 alkyl group; the branched C3 to C20 alkyl group; or the aryl groups according to R1, R2, R3, R4, R5, R6 are substituted. More preferably, the substituents are selected independently of each other from the group consisting of hydroxyl, amino, aldehyde, carboxyl, ester, sulfonic acid, mercapto, methoxy, ethoxy, halogen such as fluorine, chlorine, bromine, iodine; allyl, vinyl, phenyl, pyridyl and naphthyl groups; more preferably from hydroxyl, aldehyde, sulfonic acid, mercapto, methoxy, ethoxy, halogen; such as fluorine, chlorine, bromine, iodine; allyl, vinyl, phenyl, pyridyl and naphthyl groups; even more preferably from hydroxyl, amino, carboxyl, ester, sulfonic acid, methoxy, ethoxy, halogen, such as fluorine, chlorine, bromine, iodine; phenyl and pyridyl groups; yet more preferably from hydroxyl, sulfonic acid, methoxy, ethoxy, halogen; such as fluorine, chlorine, bromine, iodine; phenyl and pyridyl groups; yet more preferably from hydroxyl, amino, carboxyl, sulfonic acid, ester, phenyl and pyridyl groups; yet more preferably from hydroxyl, sulfonic acid, phenyl and pyridyl groups; yet more preferably from hydroxyl, amino, and pyridyl groups; most preferably from hydroxyl and pyridyl groups.

In another embodiment, the linear alkyl groups, the branched alkyl groups or the aryl groups according to R1, R2, R3, R4, R5, R6 as defined in the above-mentioned embodiments are substituted. Preferably, the substituents are selected independently of each other from the group consisting of hydroxyl, sulfonic acid, mercapto, allyl, vinyl, phenyl, pyridyl and naphthyl groups; more preferably from hydroxyl, sulfonic acid, mercapto, phenyl, pyridyl and naphthyl groups; even more preferably from hydroxyl, sulfonic acid, mercapto and pyridyl; even more preferably from hydroxyl, and pyridyl; and most preferably from hydroxyl.

In another embodiment, the linear alkyl groups, the branched alkyl groups or the aryl groups according to R1, R2, R3, R4, R5, R6 as defined in the above-mentioned embodiments are substituted and the one or more substituents comprise at least one hydroxyl group. Optionally, the linear alkyl groups, the branched alkyl groups or the aryl groups according to R1, R2, R3, R4, R5, R6 as defined in the above-mentioned embodiments may have further substituents. Preferably, the further substituents are selected independently of each other from the group consisting of amino, aldehyde, carboxyl, ester, sulfonic acid, mercapto, methoxy, ethoxy, halogen; such as fluorine, chlorine, bromine, iodine; allyl, vinyl, phenyl, pyridyl and naphthyl groups; more preferably from aldehyde, sulfonic acid, mercapto, methoxy, ethoxy, halogen; such as fluorine, chlorine, bromine, iodine; allyl, vinyl, phenyl, pyridyl and naphthyl groups; even more preferably from amino, carboxyl, ester, sulfonic acid, methoxy, ethoxy, halogen; such as fluorine, chlorine, bromine, iodine; phenyl and pyridyl groups; yet more preferably from sulfonic acid, methoxy, ethoxy, halogen; such as fluorine, chlorine, bromine, iodine; phenyl and pyridyl groups; yet more preferably from amino, carboxyl, sulfonic acid, ester, phenyl and pyridyl groups; yet more preferably from sulfonic acid, phenyl and pyridyl groups; yet more preferably from amino, and pyridyl groups; most preferably from pyridyl groups.

In a further preferred embodiment, the at least one unsaturated compound according to (iii) is selected from the group comprising:

(01)
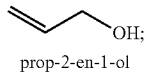
prop-2-en-1-ol

(02)
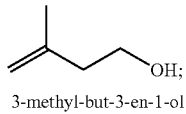
3-methyl-but-3-en-1-ol

(03)
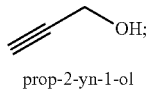
prop-2-yn-1-ol

(04)
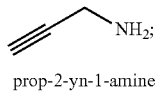
prop-2-yn-1-amine

(05)
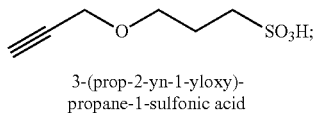
3-(prop-2-yn-1-yloxy)-
propane-1-sulfonic acid

(06)
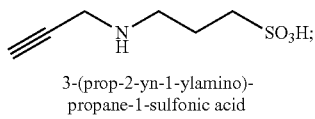
3-(prop-2-yn-1-ylamino)-
propane-1-sulfonic acid

(07)
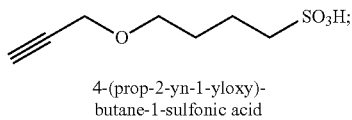
4-(prop-2-yn-1-yloxy)-
butane-1-sulfonic acid

(08)
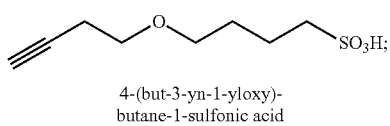
4-(but-3-yn-1-yloxy)-
butane-1-sulfonic acid

(09)
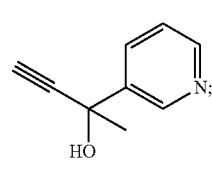
2-(pyridine-3-yl)but-3-yn-2-
ol

(10)
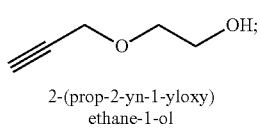
2-(prop-2-yn-1-yloxy)
ethane-1-ol

(11)
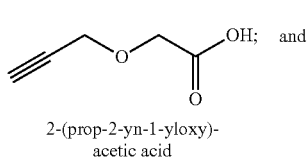 and
2-(prop-2-yn-1-yloxy)-
acetic acid

(12)
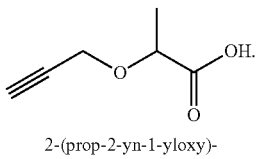
2-(prop-2-yn-1-yloxy)-
propanoic acid

In a more preferred embodiment, the at least one unsaturated compound according to (iii) is selected from the group comprising prop-2-en-1-ol, 3-methylbut-3-en-1-ol, prop-2-yn-1-ol, 3-(prop-2-yn-1-yloxy)propane-1-sulfonic acid, 3-(prop-2-yn-1-ylamino)-propane-1-sulfonic acid, 4-(prop-2-yn-1-yloxy)butane-1-sulfonic acid, 4-(but-3-yn-1-yloxy)butane-1-sulfonic acid, 2-(pyridine-3-yl)but-3-yn-2-ol, 2-(prop-2-yn-1-yloxy)ethan-1-ol, 2-(prop-2-yn-1-yloxy)-acetic acid, and 2-(prop-2-yn-1-yloxy)propanoic acid, even more preferably prop-2-en-1-ol, 3-methylbut-3-en-1-ol, prop-2-yn-1-ol, prop-2-yn-1-amine, 3-(prop-2-yn-1-yloxy)propane-1-sulfonic acid, 2-(pyridine-3-yl)but-3-yn-2-ol, and 2-(prop-2-yn-1-yloxy)ethane-1-ol; yet more preferably prop-2-en-1-ol, 3-methylbut-3-en-1-ol, prop-2-yn-1-ol, 3-(prop-2-yn-1-yloxy)propane-1-sulfonic acid, 2-(pyridine-3-yl)but-3-yn-2-ol, and 2-(prop-2-yn-1-yloxy)ethane-1-ol; yet more preferably prop-2-en-1-ol, 3-methylbut-3-en-1-ol, 3-(prop-2-yn-1-yloxy)propane-1-sulfonic acid, and 2-(pyridine-3-yl)but-3-yn-2-ol; most preferably prop-2-en-1-ol, 3-methylbut-3-en-1-ol, and 2-(pyridine-3-yl)but-3-yn-2-ol.

In so far as the term "alkyl" is used in this description and in the claims, it refers to a hydrocarbon radical with the general chemical formula $C_nH_{2n+1}$, n being an integer from 1 to 20. Alkyl residues can be linear or branched and they are preferably saturated. For example, a linear C1 to C20 alkyl group means a linear alkyl group having a number of overall C atoms ranging from 1 to 20, respectively. A branched C3 to C20 alkyl group means a branched alkyl group in which the sum of C atoms in the main chain plus C atoms in the branching chains results in a number of overall C atoms ranging from 3 to 20, respectively. A linear C1 to C10 alkyl group or a branched C3 to C10 alkyl group for example includes methyl, ethyl, propyl, butyl, pentyl, hexyl, heptyl, octyl, nonyl or decyl. A linear C1 to C5 alkyl group or a branched C3 to C6 alkyl group for example may include methyl, ethyl, propyl, butyl, pentyl or hexyl. Alkyl can be substituted by replacing an H-atom in each case by a substituent as outlined above for R1, R2, R3, R4, R5, R6.

In so far as the term "aryl" is used in this description and in the claims, it refers to ring-shaped aromatic hydrocarbon radicals, for example phenyl, pyridyl or naphthyl. Furthermore, aryl can be substituted by replacing an H-atom in each case by a substituent as outlined above for R1, R2, R3, R4, R5, R6.

Preferably, the at least one unsaturated compound according to Formulae (I) or (II) has a concentration in the aqueous plating bath composition according to the invention ranging from 0.01 to 500 mg/l; preferably from 0.1 to 250 mg/l; more preferably from 0.5 to 250 mg/l; even more preferably from 1 to 220 mg/l. In one embodiment, more than one of the at least one unsaturated compound according to Formulae (I) or (II) are present in the aqueous plating bath composition according to the invention and the concentration of each individual unsaturated compound is in the ranges as defined above. In another embodiment, more than one of the at least one unsaturated compound according to Formulae (I) or (II) are present in the aqueous plating bath composition according to the invention and the sum of concentrations of all unsaturated compounds is in the concentration ranges as defined above.

The aqueous plating bath composition according to the invention comprises at least one source for palladium ions. Preferably, the at least one source for palladium ions is a water soluble palladium compound. More preferably, the at least one source for palladium ions is selected from the group comprising palladium chloride, palladium acetate, palladium sulfate and palladium perchlorate. Optionally, complex compounds comprising a palladium ion and a complexing agent, preferably a nitrogenated complexing agent, for palladium ions can be added to the plating bath instead of forming such a complex compound in the plating bath by adding a palladium salt and said complexing agent for palladium ions to the plating bath as separate ingredients. Suitable complex compounds as sources for palladium ions are for example complex compounds comprising palladium ions and complexing agents; preferably nitrogenated complexing agents; more preferably ethane-1,2-diamine and/or alkyl substituted ethane-1,2-diamines. Suitable complex compounds may further comprise counter ions to palladium ions; preferably chloride, acetate, sulfate or perchlorate. Suitable nitrogenated complexing agents and alkyl substituted ethane-1,2-diamines are defined below as complexing agents. Preferably, suitable complex compounds as sources for palladium ions are for example dichloro ethane-1,2-diamine palladium, diacetato ethane-1,2-diamine palladium; dichloro $N^1$-methylethane-1,2-diamine palladium; diacetato $N^1$-methylethane-1,2-diamine; dichloro $N^1,N^2$-dimethylethane-1,2-diamine; diacetato $N^1,N^2$-dimethylethane-1,2-diamine; dichloro $N^1$-ethylethane-1,2-diamine; diacetato $N^1$-ethylethane-1,2-diamine, dichloro $N^1,N^2$-diethylethane-1,2-diamine; and diacetato $N^1,N^2$-diethylethane-1,2-diamine.

The concentration of palladium ions in the composition ranges from 0.5 to 500 mmol/l, preferably from 1 to 100 mmol/l.

The aqueous plating bath composition according to the invention further comprises at least one reducing agent for palladium ions. The reducing agent makes the plating bath an autocatalytic, i.e. an electroless plating bath. Palladium ions are reduced to metallic palladium in the presence of said reducing agent. This plating mechanism differentiates the plating bath according to the invention from 1) immersion-type palladium plating baths which do not contain a reducing agent for palladium ions and 2) plating baths for electroplating of palladium which require an external electrical current in order to deposit a palladium layer.

The at least one reducing agent for palladium ions is preferably a chemical reducing agent. Reducing agents provide the electrons necessary to reduce metal ions to their metallic form and thereby form a metal deposit on a substrate. More preferably, the at least one reducing agent for palladium ions is a non-metallic reducing agent, e.g. the reducing agent is not tin compounds or tin ions.

More preferably, the at least one reducing agent for palladium ions is selected from the group comprising hypophosphorous acid, amine boranes, borohydrides, hydrazine, formaldehyde, formic acid, derivatives of the aforementioned and salts thereof.

Even more preferably, the at least one reducing agent for palladium ions is a reducing agent for depositing pure palladium deposits. Pure palladium deposits are deposits containing palladium in an amount ranging from 98.0 to 99.99 wt.-% or higher, preferably from 99.0 to 99.99 wt.-% or higher.

Yet even more preferably, the at least one reducing agent for palladium ions is selected from the group consisting of hydrazine, formaldehyde, formic acid, derivatives of the aforementioned and salts thereof.

Yet even more preferably, the at least one reducing agent for palladium ions is selected from the group consisting of formic acid, derivatives of formic acid and salts of the aforementioned. The aqueous plating bath composition according to the invention is particularly suitable for depositing palladium layers in the presence of formic acid, derivatives and salts of the aforementioned as reducing agent.

Suitable counter ions for salts of the at least one reducing agent for palladium ions are for example selected from lithium, sodium, potassium and ammonium.

Preferably, the concentration of the at least one reducing agent for palladium ions in the aqueous plating bath composition according to the invention ranges from 10 to 1000 mmol/l.

The aqueous plating bath composition of the invention is particularly suitable for depositing pure palladium layers. Pure palladium layers are particularly suitable for high temperature applications like in motor control units as pure palladium layers allow for sufficient thermal stability of bonded or soldered connections.

For depositing pure palladium layers, hypophosphorous acid and/or amine boranes and/or borohydrides, derivatives of the aforementioned and salts thereof are not suitable as the reducing agent because palladium alloy layers are deposited from plating bath compositions containing such reducing agents.

The aqueous plating bath composition according to the invention may further comprise at least one complexing agent for palladium ions. A complexing agent (sometimes also referred to as chelating agent) keeps metal ions dissolved and prevents their undesired precipitation from solution.

Preferably, the at least one complexing agent is a nitrogenated complexing agent for palladium ions. More preferably, the at least one nitrogenated complexing agent is selected from the group comprising primary amines, secondary amines and tertiary amines. Even more preferably, the at least one nitrogenated complexing agent is selected from the group comprising diamines, triamines, tetraamines and higher homologues thereof. Even more preferably, the at least one nitrogenated complexing agent is different from the unsaturated compounds according to Formulae (I) or (II), if such unsaturated compounds are selected from unsaturated compounds according to Formulae (I) or (II) having one or more nitrogen atoms or having one or more substituent selected from amino groups. Vice versa, the unsaturated compounds according to Formulae (I) or (II) are preferably different from the at least one complexing agent for palladium ions, more preferably from the at least one nitrogenated complexing agent, if the unsaturated compounds according to Formulae (I) or (II) are selected from unsaturated compounds having one or more nitrogen atoms or having one or more substituents selected from amino groups.

Suitable amines are for example ethane-1,2-diamine ($NH_2$—$CH_2$—$CH_2$—$NH_2$, ethylene diamine); alkyl substituted ethane-1,2-diamines; 1,3-diamino-propane; 1,2-bis(3-amino-propyl-amino)-ethane; diethylene-triamine; diethylene-triamine-penta-acetic acid; N-(2-hydroxy-ethyl)-ethylene-diamine; ethylene-diamine-N,N-diacetic acid; 1,2-di-amino-propyl-amine; 1,3-diamino-propyl-amine; 3-(methyl-amino)-propyl-amine; 3-(dimethyl-amino)-propyl-amine; 3-(diethyl-amino)-propyl-amine; bis-(3-aminopropyl)-amine; 1,2-bis-(3-amino-propyl)-alkyl-amine; diethylene-triamine; triethylene-tetramine; tetra-ethylene-pentamine; penta-ethylene-hexamine and mixtures thereof.

Suitable alkyl substituted ethane-1,2-diamines are for example $N^1$-methylethane-1,2-diamine ($CH_3$—NH—$CH_2$—$CH_2$—$NH_2$); $N^1,N^2$-dimethylethane-1,2-diamine ($CH_3$—NH—$CH_2$—$CH_2$—NH—$CH_3$); $N^1,N^1$-dimethyl-ethane-1,2-diamine (($CH_3$)$_2$—N—$CH_2$—$CH_2$—$NH_2$); $N^1,N^1,N^2$-trimethylethane-1,2-diamine (($CH_3$)$_2$—N—$CH_2$—$CH_2$—NH—$CH_3$); $N^1,N^1,N^2,N^2$-tetramethylethane-1,2-diamine (($CH_3$)$_2$—N—$CH_2$—$CH_2$—N—($CH_3$)$_2$); $N^1$-ethylethane-1,2-diamine ($C_2H_5$—NH—$CH_2$—$CH_2$—$NH_2$); $N^1,N^2$-diethylethane-1,2-diamine ($C_2H_5$—NH—$CH_2$—$CH_2$—NH—$C_2H_5$); $N^1$-ethyl-$N^2$-methylethane-1,2-diamine ($C_2H_5$—NH—$CH_2$—$CH_2$—NH—$CH_3$); $N^1$-ethyl-$N^1$-methylethane-1,2-diamine (($CH_3$)($C_2H_5$)—N—$CH_2$—$CH_2$—$NH_2$); $N^1,N^1$-diethylethane-1,2-diamine (($C_2H_5$)$_2$—N—$CH_2$—$CH_2$—$NH_2$); $N^1$-ethyl-$N^1,N^2$-dimethylethane-1,2-diamine (($CH_3$)($C_2H_5$)—N—$CH_2$—$CH_2$—NH—$CH_3$); $N^1,N^2$-diethyl-$N^1$-methylethane-1,2-diamine (($CH_3$)($C_2H_5$)—N—$CH_2$—$CH_2$—NH—($C_2H_5$)); $N^1,N^1$-diethyl-$N^2$-methylethane-1,2-diamine (($C_2H_5$)$_2$—N—$CH_2$—$CH_2$—NH—$CH_3$); $N^1,N^1,N^2$-triethylethane-1,2-diamine (($C_2H_5$)$_2$—N—$CH_2$—$CH_2$—NH—$C_2H_5$); $N^1$-ethyl-$N^1,N^2,N^2$-trimethylethane-1,2-diamine (($CH_3$)($C_2H_5$)—N—$CH_2$—$CH_2$—N—($CH_3$)$_2$); $N^1,N^2$-diethyl-$N^1,N^2$-dimethyl-ethane-1,2-diamine (($CH_3$)($C_2H_5$)—N—$CH_2$—$CH_2$—N—($CH_3$)($C_2H_5$)); $N^1,N^1$-diethyl-$N^2,N^2$-dimethylethane-1,2-diamine (($C_2H_5$)$_2$—N—$CH_2$—$CH_2$—N—($CH_3$)$_2$); $N^1,N^1,N^2$-triethyl-$N^2$-methylethane-1,2-diamine (($C_2H_5$)$_2$—N—$CH_2$—$CH_2$—N—($CH_3$)($C_2H_5$)); $N^1,N^1,N^2,N^2$-tetraethylethane-1,2-diamine (($C_2H_5$)$_2$—N—$CH_2$—$CH_2$—N—($C_2H_5$)$_2$) and mixtures thereof.

Preferably, the mole ratio of the complexing agent for palladium ions and palladium ions in the composition according to the invention ranges from 0.5:1 to 50:1, more preferably from 1:1 to 50:1, even more preferably from 2:1 to 20:1, most preferably from 5:1 to 10:1.

Optionally, the at least one unsaturated compound selected from compounds according to Formulae (I) and (II) is present in the aqueous plating bath composition according to the invention together with at least one further stabilizing agent. Stabilizing agents, also referred to as stabilizers, are compounds that stabilize an electroless metal plating solution against undesired outplating in the bulk solution and spontaneous decomposition. The term "outplating" means undesired and/or uncontrolled deposition of the metal on surfaces other than substrate surfaces.

The at least one further stabilizing agent may be selected from the group comprising compounds of the elements selenium, tellurium, copper, nickel, and iron and/or mercapto-benzothiazole, seleno-cyanates, thiourea, saccharin, ferro-cyanates; 4-nitrobenzoic acid; 3,5-dinitrobenzoic acid; 2,4-dinitrobenzoic acid; 2-hydroxy-3,5-dinitrobenzoic acid; 2-acetylbenzoic acid; 4-nitrophenol and their corresponding ammonium, sodium and potassium salts.

Preferably, the concentration of such further stabilizing agents in the composition according to the invention ranges from 0.01 to 500 mg/l, more preferably from 0.1 to 200 mg/l, even more preferably from 1 to 200 mg/l, and most preferably from 10 to 100 mg/l.

Preferably, however, the aqueous plating bath composition according to the invention is essentially free of the aforementioned further stabilizing agents selected from the group comprising compounds of the elements selenium, tellurium, copper, nickel, iron and/or mercapto-benzothiazole, seleno-cyanates, thiourea and ferro-cyanates because such further stabilizing agents are either co-deposited with palladium (e.g. copper ions) and thereby form a palladium alloy which is not preferred, or are toxic substances (e.g. thiourea).

Preferably, the aqueous plating bath composition according to the invention is an acidic plating bath. The pH-value of the aqueous plating bath composition more preferably ranges from 4 to 7, even more preferably from 5 to 6. The pH preferably is adjusted using pH adjustors selected from sodium hydroxide, potassium hydroxide, caesium hydroxide, sulfuric acid and methane sulfonic acid.

The invention further relates to a method for electroless palladium plating comprising
the steps of
a) providing a substrate,
b) contacting the substrate with the aqueous plating bath composition according to the invention and thereby depositing a layer of palladium onto at least a portion of the substrate.

Preferably, the method steps are performed in the order described above. Preferably, the substrate has a metal surface.

Electroless palladium plating or electroless deposition of palladium is preferably carried out by contacting a substrate having a metal surface with the composition according to the invention and thereby depositing a layer of palladium onto at least a portion of the metal surface of the substrate. Preferably, the metal surface or the portion thereof to be coated with palladium is selected from the group comprising copper, copper alloys, nickel, nickel alloys, cobalt, cobalt alloys, platinum, platinum alloys, gold, gold alloys, and gallium arsenide. The metal surface or the portion thereof to be coated is for example part of a printed circuit board, an IC substrate or a semiconducting wafer. Palladium layers are used for example on semiconducting wafers as noble metal, wire-bondable and solderable finishes of semiconductor chips, light emitting diodes (LED) or solar cells.

Suitable methods for contacting the substrate with the aqueous plating bath composition are for example dipping the substrate into the composition or spraying the composition onto the substrate.

Preferably, the substrate is contacted with the aqueous plating bath composition according to step b) at a temperature of 30 to 95° C., more preferably of 30 to 85° C., even more preferably of 50 to 85° C., yet even more preferably of 30 to 65° C. Preferably, the substrate is contacted with the composition for 1 to 60 min, more preferably for 5 to 20 min. Preferably, the substrate is contacted with the aqueous plating bath composition to give a palladium plated layer ranging in thickness from 0.01 to 5.0 μm, more preferably from 0.02 to 2.0 μm and even more preferably from 0.05 to 0.5 μm.

The thickness of palladium layers was measured by x-ray fluorescence (XRF) which is well known to persons skilled in the art. The XRF measurements make use of the characteristic fluorescence radiation emitted from a sample (substrate, deposit) being excited with x-rays. By evaluating the wavelength and intensities and assuming a layered structure of the sample, layer thicknesses can be calculated.

In one embodiment of the invention, a thin activation layer of palladium is first deposited onto the substrate, preferably a substrate having a metal surface, by an immersion-type plating method (exchange reaction) followed by palladium deposition from the aqueous plating bath composition according to the invention.

Activation methods for the metal surface prior to electroless palladium deposition are known in the art and can be applied to work within the invention. A suitable aqueous activation bath may comprise a palladium salt such as palladium acetate, palladium sulfate, palladium chloride and palladium nitrate, an acid such as nitric acid, sulfuric acid and methane sulfonic acid and optionally a complexing agent for palladium ions such as primary amines, secondary amines, tertiary amines and ethanolamines. Optionally, such an activation bath further contains an oxidizing agent such as nitrate ions, perchlorate ions, chlorate ions, perborate ions, periodate ions, peroxo-disulfate ions and peroxide ions.

The concentration of the palladium salt in the aqueous activation bath ranges from 0.005 to 20 g/l, preferably from 0.05 to 2.0 g/l. The concentration of the complexing agent for palladium ions ranges from 0.01 to 80 g/l, preferably from 0.1 to 8 g/l.

The pH-value of the aqueous activation bath preferably ranges from 0 to 5, preferably from 1 to 4.

Typically, the substrates are immersed in the aqueous activation bath at 25 to 30° C. for one to four minutes. Prior to immersing the substrate in an aqueous activation bath, the metal surface of the substrate is cleaned. For this purpose, etch cleaning is usually carried out in oxidizing, acidic solutions, for example a solution of sulfuric acid and hydrogen peroxide. Preferably, this is followed by another cleaning in an acidic solution, such as, for example, a sulfuric acid solution.

The unsaturated compounds according to Formulae (I) and (II) provide the aqueous plating bath composition according to the invention with an improved stability against undesired decomposition. Further, the unsaturated compounds according to Formulae (I) and (II) provide the aqueous plating bath composition with a prolonged life time because the undesired decomposition of the plating bath is suppressed. Thus, the unsaturated compounds according to Formulae (I) and (II) act as stabilizing agents in the aqueous plating bath composition for electroless deposition of palladium, in particular for electroless deposition of pure palladium.

Shortened life time of an electroless palladium plating bath may be due to contaminations which cause undesired decomposition of the bath. Electroless palladium plating baths are sensitive to contaminations, in particular to metal ions. The unsaturated compounds according to Formulae (I) and (II) provide the aqueous plating bath composition according to the invention with decreased sensitivity to contaminations, in particular to metal ions.

The aqueous plating bath composition and the method for electroless palladium plating according to the invention enable plating of palladium layers having desired properties such as low internal stress and sufficient adhesion to the underlying substrate.

A deposited palladium layer having low stress is of advantage as it has a better adhesion to the subjacent substrate surface. In contrast, a palladium layer having high stress may delaminate from the subjacent substrate surface. This causes gaps between the palladium layer and the substrate surface. These gaps may be entered by process solutions of subsequent manufacturing steps or by gases which in turn results in corrosion.

If the substrate is a silicon wafer, depositing a palladium layer having high stress causes the wafer to bend or even to break. If the wafer does not have a perfect flat profile any more subsequent manufacturing steps like transporting or lithographic steps become difficult to perform as the manufacturing equipment does not fit to a bent form of the wafer. Thus, a bent or broken wafer is a high loss.

In addition, depositing palladium layers having low stress using the aqueous plating bath composition and method of the invention is possible even at low temperatures like 30 to 65° C. in comparison to known electroless palladium plating compositions and methods. Operating the bath at a higher temperature may increase the risk of destabilising the bath. It requires higher energy consumption. It may be of disadvantage for layers of some metals also present on the substrate to be plated. For example, aluminium or copper layers may suffer corrosion when present on a substrate which is plated with palladium from a deposition bath at higher temperatures. The unsaturated compounds according to Formulae (I) and (II) of the invention allow for electrolessly depositing palladium layers at lower temperatures ranging from 30 to 65° C. Thus, stability of the aqueous plating bath compositions of the invention is maintained and corrosion of metal layers also present on the substrate during deposition of palladium from the composition is prevented.

Furthermore, the stable performance of the aqueous plating bath composition in the method for electroless palladium plating of the invention allows deposition of palladium layers having the desired properties over an extended period of time in comparison to methods for electroless palladium plating known in the art.

The plating bath according to the invention has an improved stability against undesired decomposition due to the unsaturated compounds according to Formulae (I) and (II) while keeping the deposition rate for palladium onto a substrate at the desired satisfying value. Adding the unsaturated compounds according to Formulae (I) and (II) to an electroless palladium plating bath allows for adjusting the deposition rate to satisfying values over the bath life time.

The unsaturated compounds according to Formulae (I) and (II) of the invention decrease the deposition rate of aqueous plating bath compositions for electroless deposition of palladium, in particular for electroless deposition of pure palladium.

The deposition rate of known electroless palladium deposition baths is usually influenced by a number of factors, e.g. by the age of the deposition bath and possible contaminations. The deposition rate of freshly prepared palladium deposition baths is usually high and subsequently decreases during bath life. Thus, in the beginning of plating, palladium layers of higher thickness are obtained than at a later time during utilization of the bath for plating. In the industrial manufacturing of palladium plated substrates it is desired to produce palladium layers of constant thickness and quality. Thus, a change in palladium layer thickness and quality during the bath life is undesired.

Adding initially the unsaturated compounds according to Formulae (I) and (II) to a freshly prepared electroless palladium plating bath or shortly after beginning of plating decreases the initially too high deposition rate to the desired satisfying range. After some time of plating the deposition rate drops due to aging of the electroless palladium plating bath. Simultaneously, the amount of unsaturated compounds according to Formulae (I) and (II) drops due to consumption and/or drag-out. The effects of dropping deposition rate and dropping amount of unsaturated compounds may compensate for each other and thus, the deposition rate stays within the desired range. Or amounts of the unsaturated compounds according to Formulae (I) and (II) which are smaller than the initially added amounts may be dosed to the electroless palladium plating bath in order to keep the deposition rate within the desired satisfying range.

Further, contaminations of an electroless palladium plating bath, e.g. contaminating organic compounds originating from ingredients of the plating bath, may increase the deposition rate of the electroless palladium plating bath to an undesired high value. By adding the unsaturated compounds according to Formulae (I) and (II) to an electroless palladium plating bath containing such contaminations the too high deposition rate is decreased to the desired range.

Thus, adding the unsaturated compounds according to Formulae (I) and (II) to an electroless palladium plating bath allows for adjusting the deposition rate to a satisfying range over the bath life time. This ensures depositing palladium layers of constant thickness and quality throughout the life time of an electroless palladium plating bath and facilitates process control of the manufacturing process. Adjusting the deposition rate to a satisfying range over the bath life time also prolongs the life time of an electroless palladium plating bath.

Thus, the invention further relates to a method for adjusting the deposition rate to a satisfying range over life time of any aqueous electroless palladium deposition bath, the method comprises the steps of
- c) providing any aqueous electroless palladium deposition bath, and
- d) adding at least one unsaturated compound according to Formulae (I) and (II) to the electroless palladium deposition bath,
- e) and thereby decreasing the deposition rate of the aqueous electroless palladium deposition bath.

The electroless palladium deposition bath may be any aqueous electroless palladium deposition bath. In one embodiment the electroless palladium deposition bath is the aqueous plating bath composition according to the invention.

In one embodiment of the invention the aqueous electroless palladium deposition bath may be a freshly prepared electroless palladium deposition bath.

In another embodiment the aqueous electroless palladium deposition bath may be an aged electroless palladium deposition bath. Aged electroless palladium plating bath means herein an electroless palladium plating bath already used for some time for plating.

Further, in a preferred embodiment, the aqueous electroless palladium deposition bath is a bath for electroless deposition of pure palladium.

The deposition rate and/or the concentration of the at least one unsaturated compound according to Formulae (I) and (II) may be determined during plating or storage. If the deposition rate is above a threshold value or the concentration of the at least one unsaturated compound according to Formulae (I) and (II) is below a threshold value, the at least one unsaturated compound according to Formulae (I) and (II) is replenished. Replenishment is performed by adding the at least one unsaturated compound according to Formulae (I) and (II) to the aqueous electroless palladium deposition bath. Preferably, the compound according to Formulae (I) and (II) is dosed to the electroless palladium plating bath in an amount corresponding to the deviation from one or both threshold values.

Thus, preferably the method for adjusting the deposition rate to a satisfying range over life time of any aqueous electroless palladium deposition bath comprises one or more of further steps
- c.i) determining the deposition rate and/or the concentration of the at least one unsaturated compound according to Formulae (I) and (II) within the aqueous electroless palladium deposition bath according to step c);
- c.ii) comparing the value for deposition rate and/or concentration of the at least one unsaturated compound according to Formulae (I) and (II) determined according to step c.i) with pre-set corresponding threshold values;
- c.iii) determining the deviation of the value for deposition rate and/or concentration of the at least one unsaturated compound according to Formulae (I) and (II) from their corresponding threshold values;
- c.iv) correlating the deviation determined according to step c.iii) to an amount of the at least one unsaturated compound according to Formulae (I) and (II) to be added to the aqueous electroless palladium deposition bath in step d).

Preferably, the method for adjusting the deposition rate according to the invention is applied if the deposition rate of an electroless palladium deposition bath is higher than desired. Then, adding at least one unsaturated compound according to Formulae (I) and/or (II) of the invention decreases the deposition rate of an electroless palladium deposition bath to the desired range.

Determining the deposition rate may be performed according to methods known in the art, e.g. by the methods described in the Examples herein. Determining the concentration of organic compounds like the at least one unsaturated compound according to Formulae (I) and (II) may be performed according to methods known in the art.

Alternatively, if the dropping behaviour of deposition rate of an electroless palladium deposition bath is already known, the unsaturated compound according to Formulae (I) and (II) may be dosed permanently or periodically to the deposition bath in pre-set amounts. Preferably, the amounts of the unsaturated compound decrease over life time of the bath.

The at least one unsaturated compound according to Formulae (I) and (II) may be added as a solid or a powder or may be dissolved in a solvent prior to its addition to the electroless palladium deposition baths. Examples for suitable solvents are water; acids like sulphuric acid, hydrochloric acid, phosphoric acid; alkaline solutions like solutions of sodium hydroxide or potassium hydroxide; and organic solvents like propanol, ethanol, methanol.

The plating bath composition for electroless deposition of palladium according to the invention is an aqueous plating bath composition, i.e. the main solvent is water. Preferably, the content of organic solvents within the aqueous plating bath composition for electroless deposition of palladium is at most 10 vol %, preferably ranges from 0 to 10 vol %, more preferably ranges from 0 to 5 vol %, even more preferably ranges from 0 to 1 vol %. Yet more preferably, the aqueous plating bath composition according to the invention does not contain organic solvents, i.e. is free of organic solvents. It is preferred to keep the content of organic solvents within the aqueous plating bath composition according to the invention as low as possible because handling of the aqueous plating bath composition becomes more difficult. Numerous organic solvents have a vapour pressure higher than water causing an unsteady volume of the aqueous plating bath composition which is difficult to be kept constant. Numerous organic solvents are easily inflammable and numerous organic solvents are toxic causing the need of more elaborate safety installations.

The invention further relates to uses of the at least one unsaturated compounds according to Formulae (I) and/or (II) for
stabilizing any aqueous electroless palladium deposition bath composition, preferably an aqueous plating bath composition for electroless deposition of palladium according to the invention, against undesired decomposition;
expanding the life time of any aqueous electroless palladium deposition bath composition, preferably an aqueous plating bath composition for electroless deposition of palladium according to the invention;

decreasing sensitivity of any aqueous electroless palladium deposition bath composition, preferably an aqueous plating bath composition for electroless deposition of palladium according to the invention, to contaminations, preferably to metal ions; and/or adjusting the deposition rate to a satisfying range over the life time of any aqueous electroless palladium deposition bath, preferably an aqueous plating bath composition for electroless deposition of palladium according to the invention.

"Expanding the life time" herein also means "increasing", "prolonging" or "extending" the life time.

EXAMPLES

The invention is further explained by the following non-limiting examples.

The preparation examples relate to the synthesis of the unsaturated compounds employed in the aqueous plating bath composition of the invention.

Preparation Example 1

Preparation of 4-(but-3-yn-1-yloxy)-butane-1-sulfonate-sodium Salt

In 85 ml THF 2.0 g (49.9 mmol) sodium hydride is suspended under Argon. To this reaction mixture 3.5 g (49.9 mmol) but-3-yn-1-ol is added drop wise at room temperature.

After finishing the hydrogen evolution 6.87 g (49.9 mmol) 1,2-oxathiane-2,2-dioxide dissolved in 20 ml THF is added drop wise at room temperature. After addition the reaction mixture was stirred for additional 12 hours and the THF removed under vacuum.

The solid residue was extracted with ethyl acetate and filtrated. The solid was dried under vacuum.

10.2 g (44.7 mmol) of a yellowish solid were obtained (89% yield).

Preparation Example 2

Preparation of 3-(prop-2-yn-1-yloxy)-propane-1-sulfonate-sodium Salt

In 70 ml THF 1.997 g (49.9 mmol) sodium hydride is suspended under Argon. To this reaction mixture 2.830 g (49.9 mmol) prop-2-yn-1-ol is added drop wise at room temperature.

After finishing the hydrogen evolution 6.1 g (49.9 mmol) 1,2-oxathiolane-2,2-dioxide dissolved in 15 ml THF is added drop wise at room temperature. After addition the reaction mixture was stirred for additional 12 hours and the THF removed under vacuum.

The solid residue was extracted with ethyl acetate and filtrated. The solid was dried under vacuum.

9.0 g (44.9 mmol) of a yellowish solid were obtained (90% yield).

Preparation Example 3

Preparation of 2-(prop-2-yn-1-yloxy)-acetate Sodium Salt 1.8 g (44 mmol) sodium hydride were suspended in 18.88 g DMF at room temperature. To this suspension 3.5 g (37 mmol) 2-chloroacetic acid are dosed within 10 min at room temperature.

In a second flask 1.8 g (44 mmol) sodium hydride were suspended in 56.6 g DMF. To this suspension 2.08 g (36.74 mmol) prop-2-yn-1-ol are given at room temperature.

After finishing the hydrogen evolution the solution of the sodium salt of the 2-chloroacetic acid is added drop wise to the solution of the sodium prop-2-yn-1-olate at room temperature within 6 minutes. After addition the reaction mixture was stirred for additional 25 hours at room temperature and heated to 50° C. for additional 10 hours.

The reaction mixture was cooled to room temperature and hydrolyzed with 20 ml water. The solvent was removed and the residue solved in 50 ml methanol and filtrated. The filtrate was evaporated and the solid residue washed with 200 ml diethylether.

The resulting solid was dried under vacuum.

4.9 g (36 mmol) of a brownish solid were obtained (98% yield).

Preparation Example 4

Preparation of 2-(prop-2-yn-1-yloxy)-propanoate Sodium Salt 1.6 g (39.11 mmol) sodium hydride were suspended in 18.88 g DMF at room temperature. To this suspension 3.8 g (33 mmol) 2-chloropropanoic acid are dosed within 10 min at room temperature.

In a second flask 1.6 g (39.11 mmol) sodium hydride were suspended in 56.64 g DMF. To this suspension 1.886 g (363.33 mmol) prop-2-yn-1-ol are given at room temperature.

After finishing the hydrogen evolution the solution of the sodium salt of the 2-chloropropanoic acid is added drop wise to the solution of the sodium prop-2-yn-1-olate at room temperature within 6 minutes. After addition the reaction mixture was stirred for additional 25 hours at room temperature and heated to 50° C. for additional 10 hours. The reaction mixture was cooled to room temperature and hydrolyzed with 20 ml water. The solvent was removed and the residue solved in 50 ml methanol and filtrated. The filtrate was evaporated and the solid residue washed with 200 ml diethylether.

The resulting solid was dried under vacuum.

4.79 g (32 mmol) of a brownish solid were obtained (96% yield).

Preparation Example 5

Preparation of 4-(prop-2-yn-1-yloxy)-butane-1-sulfonate-sodium Salt

In 45 mL THF 1.999 g (50 mmol) sodium hydride is suspended under Argon. To this reaction mixture 2.830 g (50 mmol) prop-2-yn-1-ol is added drop wise at room temperature.

After finishing the hydrogen evolution 6.87 g (50 mmol) 1,2-oxathiane-2,2-dioxide dissolved in 20 mL THF is added drop wise at room temperature. After addition the reaction mixture was stirred for additional 12 hours and the THF removed under vacuum.

The solid residue was extracted with ethyl acetate and filtrated. The solid was dried under vacuum.

8.4 g (39.2 mmol) of a yellowish solid were obtained (78% yield).

Preparation Example 6

Preparation of 2-(pyridine-3-yl)but-3-yn-2-ol 200 mL of a 0.5M solution of ethinylmagnesium bromide in THF (0.1 mol) are dosed to 11.63 g (0.096 mol) 3-acetyl-pyridine diluted in 100 mL THF at −10° C.

After finishing the addition, the reaction mixture was heated to room temperature (about 22° C.) and stirred for additional 20 hours at room temperature.

The reaction mixture was quenched with 1 L water saturated with sodium chloride and extracted three times with ethyl acetate. The combined organic phases were dried over sodium sulfate and the solvent was removed under vacuum. The obtained crude reaction product was purified via column chromatography using Silica Gel 60 of Merck KGaA, Germany (Hexane:ethyl acetate 2:1 and 1:1).

6.9 g (46.9 mmol) of an orange solid were obtained (48.8% yield).

General Procedure

Palladium plating bath matrix and palladium plating:

Pre-treated substrates were plated with palladium according to the following procedure unless stated otherwise.

A plating bath matrix (Xenolyte Pd LL, product of Atotech Deutschland GmbH) having a pH-value of 5.5 and comprising water, palladium ions, sodium formate as reducing agent for palladium ions and ethylene diamine as complexing agent for palladium ions was used throughout all examples.

Different amounts of the unsaturated compound according to Formulae (I) and (II) of the invention were added to 2 l of individual palladium plating bath matrices throughout plating examples 1 and 2. The aqueous plating bath compositions were held at 60° C. during plating. The substrates were immersed into the aqueous plating bath compositions for 6 minutes. Afterwards, the substrates were rinsed with deionized water for 1 minute and dried with air pressure.

Plating Example 1

Substrates and Pre-Treatment:

Test chips made of silicon covered with a $SiO_2$ layer and having four dies each were used as substrates. Each die had several isolated pads of an aluminum-copper alloy on its surface. The pads had different sizes ranging from 10 μm to 1000 μm in diameter and distances between pads ranged from 20 μm to 1000 μm.

The test chips were already pre-treated by double-zincation. Afterwards, the test chips were nickel plated using an electroless nickel plating bath (Xenolyte Ni MP, product of Atotech Deutschland GmbH) containing a nickel(II) salt, a reducing agent for nickel ions, a complexing agent for nickel ions and a stabilizer. The nickel plating bath had a pH value of 4.5 and was held at 87° C. during plating. The test chips were immersed into the nickel plating bath for 10 minutes and a nickel layer of 3 μm thickness was plated onto the test chips. Afterwards, the test chips were rinsed in deionized water. and subjected to the following palladium plating bath compositions.

0 to 100 mg/l of unsaturated compounds according to Formula (I) (see table 1 for individual compounds and concentrations) were added to the plating bath matrix. The pre-treated substrates were plated with palladium by subjecting them to the resulting palladium plating bath compositions. Plating was performed according to the General procedure.

The deposition rate was determined as follows. The thickness of the palladium layers deposited in various aqueous plating bath compositions tested was determined with an X-ray fluorescence method (XRF; Fischer, Fischerscope® X-Ray XDV®-11). The thickness was measured on four palladium pads for each substrate. The deposition rate for each aqueous plating bath composition was calculated by dividing the measured thickness of the palladium layers deposited by the plating time of 6 minutes.

The aqueous plating bath compositions and mean values of deposition rates for each plating bath composition are summarised in table 1 and shown in FIG. 1.

TABLE 1

Deposition rate of aqueous plating bath compositions containing unsaturated compounds according to Formula (I) of the invention

| | Prop-2-en-1-ol | | 3-Methyl-but-3-en-1-ol | |
|---|---|---|---|---|
| | Concentration [mg/l] | Deposition rate [μm/hour] | Concentration [mg/l] | Deposition rate [μm/hour] |
| comparative | 0 | 2.94 | 0 | 2.94 |
| according to invention | 10 | 2.10 | 10 | 2.70 |
| | 100 | 0.48 | 100 | 1.86 |

Prop-2-en-1-ol (allylalcohol) and 3-Methyl-but-3-en-1-ol are commercially available, e.g. from BASF AG.

Plating Example 2

Copper plates having dimensions of 7×7 $cm^2$ were used as substrates. The copper plates were pre-treated by electrolytical degreasing with Nonacid 701 (product of Atotech Deutschland GmbH), immersing into a sulfonic acid based pre-dip solution (Spherolyte special acid, product of Atotech Deutschland GmbH) and activating by an immersion type palladium bath (Aurotech SIT Activator, product of Atotech Deutschland GmbH) with a dense palladium layer.

0 to 200 mg/l of unsaturated compounds according to Formula (II) (see table 2) were added to the plating bath matrix. The pre-treated substrates were plated with palladium by subjecting them to the resulting palladium plating bath compositions. Plating was performed according to the General procedure.

The deposition rate was measured by weight gain, divided by the plating time of 6 minutes.

Figure 2:
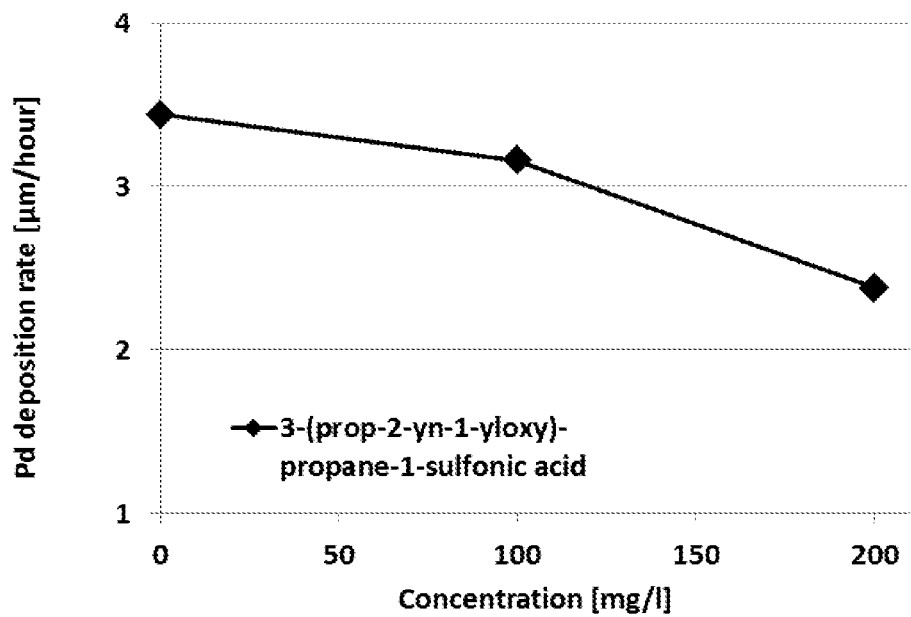
FIG. 2 shows the deposition rate of an aqueous plating bath composition containing 3-(prop-2-yn-1-yloxy)-propane-1-sulfonic acid.
Figure 3:
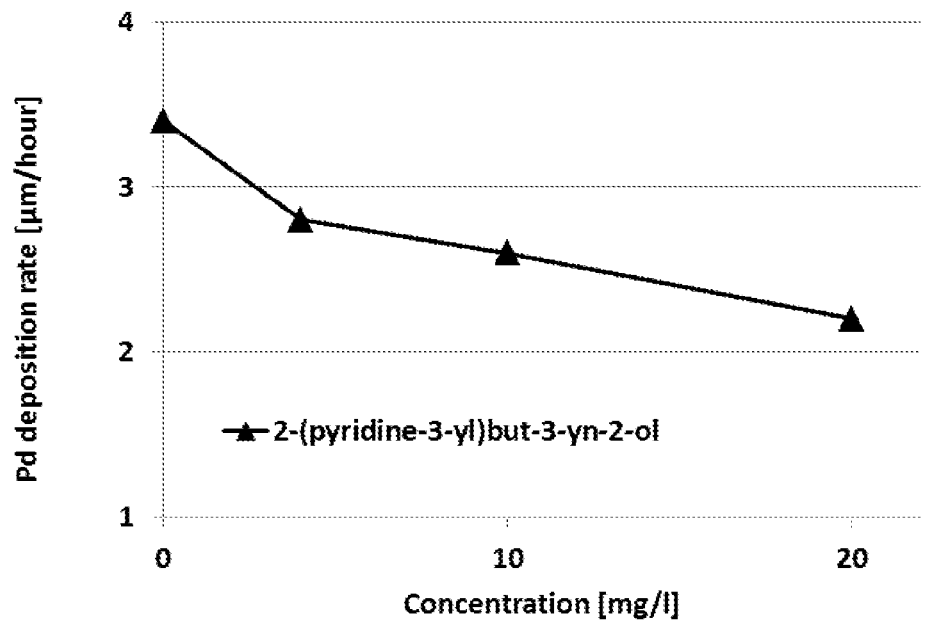
FIG. 3 shows the deposition rate of an aqueous plating bath composition containing 2-(pyridine-3-yl)but-3-yn-2-ol.

The aqueous plating bath compositions and plating results are summarised in Table 2 and shown in FIGS. 2 and 3.

TABLE 2

Deposition rate of aqueous plating bath compositions containing unsaturated compounds according to Formula (II) of the invention

| | 3-(prop-2-yn-1-yloxy)-propane-1-sulfonic acid (Preparation Example 2) | | 2-(pyridine-3-yl)but-3-yn-2-ol (Preparation Example 6) | |
|---|---|---|---|---|
| | Concentration [mg/l] | Deposition rate [μm/hour] | Concentration [mg/l] | Deposition rate [μm/hour] |
| comparative | 0 | 3.44 | 0 | 3.4 |
| according to invention | 100 | 3.16 | 4 | 2.8 |
| | 200 | 2.38 | 10 | 2.6 |
| | | | 20 | 2.2 |

Summary of Results of Plating Examples 1 and 2

Examples 1 and 2 showed that the deposition rate of aqueous plating bath compositions containing unsaturated compounds according to Formulae (I) or (II) were lower compared to compositions lacking the unsaturated compounds. The deposition rate decreased with increasing concentration of the unsaturated compounds.

The deposits obtained from aqueous plating bath compositions containing unsaturated compounds according to Formulae (I) or (II) were ductile, had a grey colour and adhered very well to the substrates.

Example 3: pH Stability Test

Unsaturated compounds according to Formula (II) (see table 3 for compounds and concentrations) were added to 2 l of individual palladium plating bath matrices as described in the General procedures. The aqueous plating bath compositions were adjusted to an initial pH of 5.5. Afterwards they were heated up to 80° C. and held at this temperature throughout the test while stirring permanently. When the compositions reached 80° C. pH measurement was started. Samples were removed from the composition every hour and the pH value determined thereof. A portion of the plating bath matrix lacking unsaturated compounds of the invention (zero sample) was treated the same way in parallel.

When palladium is deposited from the composition the nitrogenated complexing agent is released from the complex of palladium and complexing agent. The release of nitrogenated complexing agent causes an increase of the pH value of the composition. This also happens when palladium precipitates or is deposited unwantedly due to instability and decomposition of the electroless palladium plating bath composition. Therefore, the change of the pH is a measure for the stability of the aqueous plating bath compositions of the invention.

Figure 4:
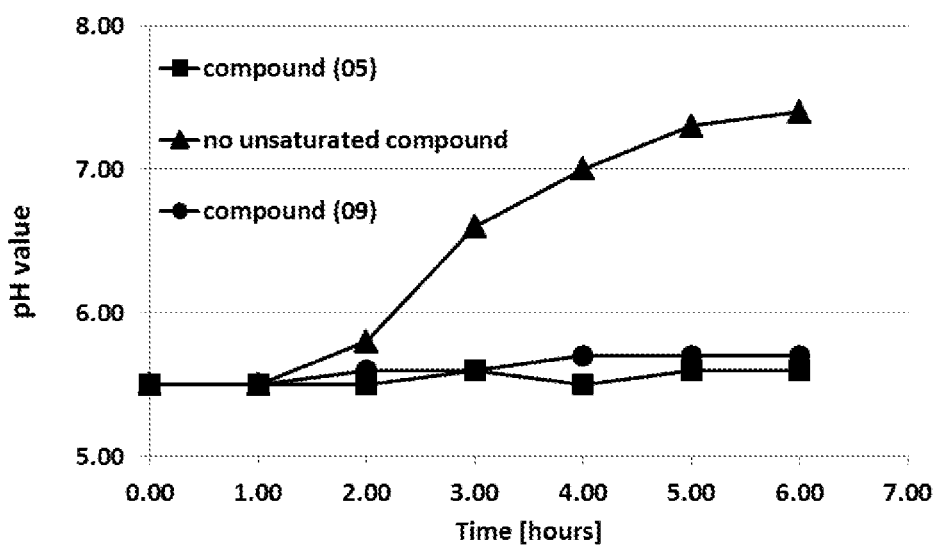
FIG. 4 shows the pH development of an aqueous plating bath composition containing unsaturated compounds according to Formulae (I) and (II) and lacking such compounds.

The development of the pH value in the aqueous plating bath compositions is summarised in Table 3 and shown in FIG. 4.

TABLE 3 pH value of aqueous plating bath compositions containing unsaturated compounds according to Formula (II) of the invention

| Time [hours] | 3-(prop-2-yn-1-yloxy)-propane-1-sulfonic acid (compound (05)) (Preparation Example 2) | | 2-(pyridine-3-yl)but-3-yn-2-ol (compound (09)) (Preparation Example 6) | |
|---|---|---|---|---|
| | Zero Sample: 0 mg/l pH | 50 mg/l pH | Zero Sample: 0 mg/l pH | 2 mg/l pH |
| 0 | 5.5 | 5.5 | 5.5 | 5.5 |
| 1 | 5.5 | 5.5 | 5.5 | 5.5 |
| 2 | 5.5 | 5.5 | 5.8 | 5.6 |
| 3 | 5.6 | 5.6 | 6.6 | 5.6 |
| 4 | 5.8 | 5.5 | 7.0 | 5.7 |
| 5 | 6.5 | 5.6 | 7.3 | 5.7 |
| 6 | 7.1 | 5.6 | 7.4 | 5.7 |

The pH value of aqueous plating bath compositions containing the unsaturated compounds is nearly constant over time while in plating bath matrices lacking the unsaturated compounds the pH value significantly increases. Thus, Example 3 shows that aqueous plating bath compositions containing unsaturated compounds according to the invention have a significantly better stability against unwanted decomposition than the plating bath matrix lacking the unsaturated compounds.

Example 4: Plating Example

The deposition rate of palladium plating baths containing different unsaturated compounds was determined as described in Plating Example 1. The aqueous plating bath compositions and plating results are summarised in Table 4.

TABLE 4

Deposition rate of aqueous plating bath compositions containing unsaturated compounds

| | Compound concentration/mg/l | | |
|---|---|---|---|
| | 0 | 50 | 100 |
| Prop-2-en-1-ol Deposition rate/μm/hour | 4.78 | 4.61 | 1.48 |
| 3-Methyl-but-3-en-1-ol Deposition rate/μm/hour | 4.80 | 3.99 | 2.84 |
| 3-(prop-2-yn-1-yloxy)-propane-1-sulfonic acid (Preparation Example 2) Deposition rate/μm/hour | 4.90 | 3.44 | 0.04 |
| Oleic acid Deposition rate/μm/hour | 4.54 | 4.37 | 4.39 |

Example 5: pH Stability Test

Stability of electroless palladium plating bath compositions against unwanted decomposition was measured as described in Example 3. 50 mg/l of unsaturated compounds were added to separate portions of palladium plating bath matrices and measurements started. The aqueous plating bath compositions and development of the pH value in the aqueous plating bath compositions is summarised in Table 5.

TABLE 5 pH value of aqueous plating bath compositions containing unsaturated compounds according to invention

| Compound | Time/hours | | | | | | |
|---|---|---|---|---|---|---|---|
| | 0 | 1 | 2 | 3 | 4 | 5 | 6 |
| Zero Sample: 0 mg/l | | | | | | | |
| pH | 5.5 | 5.5 | 5.5 | 5.7 | 6.2 | 6.9 | 7.2 |
| Prop-2-en-1-ol (according to Formula (I)) | | | | | | | |
| pH | 5.5 | 5.5 | 5.5 | 5.5 | 5.5 | 5.5 | 5.5 |
| 3-Methyl-but-3-en-1-ol (according to Formula (I)) | | | | | | | |
| pH | 5.5 | 5.5 | 5.5 | 5.5 | 5.5 | 5.6 | 5.6 |
| 3-(prop-2-yn-1-yloxy)-propane-1-sulfonic acid (Preparation Example 2) | | | | | | | |
| pH | 5.5 | 5.5 | 5.5 | 5.5 | 5.5 | 5.5 | 5.5 |

Example 6: Determination of Stress

Stress in the palladium coating was measured using a stress-strip finger. The test strips were made of copper and had spring like properties.

50 mg/l of prop-2-en-1-ol (unsaturated compound according to Formula (I)) were added to one portion of the palladium plating bath matrix according to the General procedure. Another portion of the plating bath matrix omitting all unsaturated compounds was used as control. The test strips were plated with palladium according to the General procedure by contacting the test strips with the resulting palladium plating bath compositions.

After plating, the test strip was mounted on the Testing Stand (Deposit stress analyzer Model No. 683 of Specialty Testing & Development Co., York, Pa., USA) which measured the distance which the test strip legs had spread after plating. The distance U is included in the following formula which allows for the deposit stress to be calculated.

$$Stress = U/3T*K$$

U is the number of increments spread, T is the deposit thickness and K is the strip calibration constant.

The palladium deposit thickness T was determined by XRF as described in Plating Example 1.

Each lot of test strips manufactured will respond with slight differences when used for deposit stress test. This degree of difference was determined by the supplier when each lot of test strips was calibrated. The value for K was supplied with each lot of test strips provided by Specialty Testing & Development Co. Table 6 shows the resulting stress values.

TABLE 6

Stress values of palladium layers deposited from aqueous plating bath compositions containing or lacking unsaturated compounds according to the invention

| Compound | Stress/MPa |
|---|---|
| Control: 0 mg/l | 4.7 |
| Prop-2-en-1-ol: 50 mg/l | 3.5 |

The invention claimed is:

1. An aqueous plating bath composition for electroless deposition of palladium, comprising
(i) at least one source for palladium ions,
(ii) at least one reducing agent for palladium ions, and
(iii) at least one unsaturated compound selected from compounds according to Formulae (I) and (II), salts thereof, and mixtures of the aforementioned

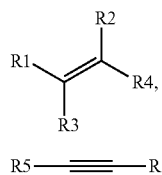

Formula (I)

R5≡≡≡R6,    Formula (II)

wherein R1, R3, R5 are selected independently of each other from the group consisting of —H; unsubstituted or substituted, linear C1 to C20 alkyl group; unsubstituted or substituted, branched C3 to C20 alkyl group; and unsubstituted or substituted aryl groups; and
wherein R2, R4 are selected independently of each other from the group consisting of —H; unsubstituted or substituted, linear C1 to C20 alkyl group; unsubstituted or substituted, branched C3 to C20 alkyl group; unsubstituted or substituted aryl groups; and —(CH(R10))$_n$-X—(C(R8)(R9))$_m$-R7; and wherein R2 is not —H if R4 is —H or R4 is not —H if R2 is —H; and wherein R6 is selected from the group consisting of unsubstituted or substituted, linear C1 to C20 alkyl group; unsubstituted or substituted, branched C3 to C20 alkyl group; unsubstituted or substituted aryl groups; and —(CH(R10))$_n$-X—(C(R8)(R9))$_m$-R7; and wherein X is selected from the group consisting of O, NH, and NCH$_3$; R7 is selected from the group consisting of hydroxyl, amino, sulfonic acid, carboxyl; R8, R9, R10 are selected independently of each other from the group consisting of hydrogen and C1 to C4 alkyl group; n is an integer ranging from 1 to 6; and m is an integer ranging from 1 to 8, and wherein substituents of the substituted, linear C1 to C20 alkyl group; the substituted, branched C3 to C20 alkyl group; or the substituted aryl groups are selected independently of each other from the group consisting of hydroxyl, aldehyde, sulfonic acid, mercapto, methoxy, ethoxy, halogen, allyl, vinyl, phenyl, pyridyl and naphthyl groups, wherein the amino group according to R7 is selected from —NH(R11), —N(R11)(R12), —N$^+$(R11)(R12)(R13), wherein R11, R12, R13 are selected independently of each other from methyl, ethyl, n-propyl and iso-propyl, and wherein the aqueous plating bath composition further comprises at least one complexinq agent for palladium ions selected from the group consisting of primary amines, secondary amines and tertiary amines.

2. The aqueous plating bath composition according to claim 1 wherein R1, R3, R5 are selected independently of each other from the group consisting of —H; unsubstituted or substituted, linear C1 to C10 alkyl group; unsubstituted or substituted, branched C3 to C10 alkyl group; and unsubstituted or substituted aryl groups; and wherein R2, R4 are selected independently of each other from the group consisting of —H; unsubstituted or substituted, linear C1 to C10 alkyl group; unsubstituted or substituted, branched C3 to C10 alkyl group; unsubstituted or substituted aryl groups; and —(CH(R10))$_n$-X—(C(R8)(R9))$_m$-R7; and wherein R2 is not —H if R4 is —H or R4 is not —H if R2 is —H; and wherein R6 is selected from the group consisting of unsubstituted or substituted, linear C1 to C10 alkyl group; unsubstituted or substituted, branched C3 to C10 alkyl group; unsubstituted or substituted aryl groups; and —(CH(R10))$_n$-X—(C(R8)(R9))$_m$-R7; and wherein X is selected from the group consisting of O and NH; R8, R9, R10 are selected independently of each other from the group consisting of hydrogen, methyl and ethyl group; n is an integer ranging from 1 to 4; and m is an integer ranging from 1 to 6.

3. The aqueous plating bath composition according to claim 1 wherein the unsubstituted or substituted aryl groups according to R1, R2, R3, R4, R5, R6 are selected independently of each other from the group consisting of phenyl, pyridyl and naphthyl.

4. The aqueous plating bath composition according to claim 1 wherein the at least one unsaturated compound according to Formulae (I) and/or (II) is selected from the group comprising prop-2-en-1-ol, 3-methylbut-3-en-1-ol, prop-2-yn-1-ol, 3-(prop-2-yn-1-yloxy)propane-1-sulfonic acid, 3-(prop-2-yn-1-ylamino)-propane-1-sulfonic acid, 4-(prop-2-yn-1-yloxy)butane-1-sulfonic acid, 4-(but-3-yn-1-yloxy)butane-1-sulfonic acid, 2-(pyridine-3-yl)but-3-yn- 2-ol, 2-(prop-2-yn-1-yloxy)ethan-1-ol, 2-(prop-2-yn-1-yloxy)-acetic acid, and 2-(prop-2-yn-1-yloxy)propanoic acid.

5. The aqueous plating bath composition according to claim 1, wherein the at least one unsaturated compound according to Formulae (I) or (II) has a concentration ranging from 0.01 to 500 mg/l.

6. The aqueous plating bath composition according to claim 1, wherein the pH-value ranges from 4 to 7.

7. The aqueous plating bath composition according to claim 1, wherein the mole ratio of the complexing agent for palladium ions and palladium ions in the electroless plating bath ranges from 0.5:1 to 50:1.

8. The aqueous plating bath composition according to claim 1, wherein the at least one reducing agent for palladium ions is selected from the group comprising hypophosphorous acid, amine boranes, borohydrides, hydrazine, formaldehyde, formic acid, derivatives of the aforementioned and salts thereof.

9. The aqueous plating bath composition according to claim 1, wherein the concentration of the at least one reducing agent ranges from 10 to 1000 mmol/l.

10. The aqueous plating bath composition according to claim 2 wherein the unsubstituted or substituted aryl groups according to R1, R2, R3, R4, R5, R6 are selected independently of each other from the group consisting of phenyl, pyridyl and naphthyl.

11. A method for electroless palladium plating comprising the steps of
  a) providing a substrate,
  b) contacting the substrate with the aqueous plating bath composition according to claim 1 and thereby depositing a layer of palladium onto at least a portion of the substrate.

12. The method for electroless palladium plating according to claim 11 wherein the substrate is contacted with the aqueous plating bath composition at a temperature of 30 to 65° C. in step b).

13. A method for adjusting the deposition rate to a satisfying range over the life time of any aqueous electroless palladium deposition bath, the method comprises the steps of
  c) providing any aqueous electroless palladium deposition bath, and
  d) adding at least one unsaturated compound according to Formulae (I) and/or (II), salts thereof, and mixture of the aforementioned to the electroless palladium deposition bath

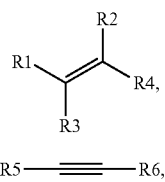

Formula (I)

Formula (II)

wherein R1, R3, R5 are selected independently of each other from the group consisting of —H; unsubstituted or substituted, linear C1 to C20 alkyl group; unsubstituted or substituted, branched C3 to C20 alkyl group; and unsubstituted or substituted, aryl groups; and wherein R2, R4 are selected independently of each other from the group consisting of —H; unsubstituted or substituted, linear C1 to C20 alkyl group; unsubstituted or substituted, branched C3 to C20 alkyl group; unsubstituted or substituted, aryl groups; and —(CH(R10)$_n$-X—(C(R8)(R9))$_m$-R7; and wherein R2 is not —H if R4 is —H or R4 is not —H if R2 is —H; and wherein R6 is selected from the group consisting of unsubstituted or substituted, linear C1 to C20 alkyl group; unsubstituted or substituted, branched C3 to C20 alkyl group; unsubstituted or substituted, aryl groups; and —(CH(R10)$_n$-X—(C(R8)(R9))$_m$-R7; and wherein X is selected from the group consisting of O, NH, and NCH$_3$; R7 is selected from the group consisting of hydroxyl, amino, sulfonic acid, and carboxyl; R8, R9 and R10 are selected independently of each other from the group consisting of hydrogen and C1 to C4 alkyl group; n is an integer ranging from 1 to 6; and m is an integer ranging from 1 to 8, and wherein substituents of the substituted, linear C1 to C20 alkyl group; the substituted, branched C3 to C20 alkyl group; or the substituted aryl groups are selected independently of each other from the group consisting of hydroxyl, aldehyde, sulfonic acid, mercapto, methoxy, ethoxy, halogen, allyl, vinyl, phenyl, pyridyl and naphthyl groups, wherein the amino group according to R7 is selected from —NH(R11), —N(R11)(R12), —N±(R11)(R12)(R13), wherein R11, R12, R13 are selected independently of each other form methyl, ethyl, n-propyl and iso-propyl, e) and thereby decreasing the deposition rate of the aqueous electroless palladium deposition bath.

14. The method for adjusting the deposition rate according to claim 13 further comprising one or more of steps
  c.i) determining the deposition rate and/or the concentration of the at least one unsaturated compound according to Formulae (I) and (II) within the aqueous electroless palladium deposition bath according to step c);
  c.ii) comparing the value for deposition rate and/or concentration of the at least one unsaturated compound according to Formulae (I) and (II) determined according to step c.i) with pre-set corresponding threshold values;
  c.iii) determining the deviation of the value for deposition rate and/or concentration of the at least one unsaturated compound according to Formulae (I) and (II) from their corresponding threshold values;
  c.iv) correlating the deviation determined according to step c.iii) to an amount of the at least one unsaturated compound according to Formulae (I) and (II) to be added to the aqueous electroless palladium deposition bath in step d).

* * * * *